(12) United States Patent
Dai et al.

(10) Patent No.: US 9,454,940 B1
(45) Date of Patent: Sep. 27, 2016

(54) GATE DRIVER ON ARRAY (GOA) CIRCUIT AND LCD DEVICE USING THE SAME

(71) Applicant: Shenzhen China Star Optoelectronics Technology Co., Ltd., Shenzhen, Guangdong (CN)

(72) Inventors: Chao Dai, Guangdong (CN); Juncheng Xiao, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 302 days.

(21) Appl. No.: 14/376,127

(22) PCT Filed: Apr. 25, 2014

(86) PCT No.: PCT/CN2014/076273
§ 371 (c)(1),
(2) Date: Jul. 31, 2014

(87) PCT Pub. No.: WO2015/161513
PCT Pub. Date: Oct. 29, 2015

(30) Foreign Application Priority Data

Apr. 21, 2014 (CN) .......................... 2014 1 0159672

(51) Int. Cl.
*G06F 3/01* (2006.01)
*G09G 3/36* (2006.01)
*H01L 27/12* (2006.01)

(52) U.S. Cl.
CPC .... *G09G 3/3648* (2013.01); *G09G 2300/0809* (2013.01); *G09G 2310/0251* (2013.01); *G09G 2310/06* (2013.01); *G09G 2310/08* (2013.01); *G09G 2320/0204* (2013.01); *H01L 27/124* (2013.01)

(58) Field of Classification Search
CPC .................... H01L 27/124; G09G 2320/0204; G09G 2310/08; G09G 2300/0809; G09G 3/3266; G09G 2310/0251
See application file for complete search history.

(56) References Cited

U.S. PATENT DOCUMENTS

2010/0214279 A1* 8/2010 Kim ....................... G09G 3/344
345/213

* cited by examiner

*Primary Examiner* — Abbas Abdulselam
(74) *Attorney, Agent, or Firm* — Andrew C. Cheng

(57) ABSTRACT

A gate driver on array (GOA) circuit for an LCD includes multiple cascaded GOA units. A Nth stage GOA unit controls a charging of a Nth stage horizontal scanning line. The Nth stage GOA unit includes a pull-up circuit, a pull-down circuit, a first pull-down holding circuit, a second pull-down holding circuit, a bridge circuit, a pull-up control circuit, a transfer circuit, and a boast capacitor. A seventh TFT connects in parallel with a third TFT of the first pull-down holding circuit. A fourteenth TFT connects in parallel with a tenth TFT of the second pull-down holding circuit. The gate of the seventh TFT and the gate of the fourteenth TFT are connected, and both connected to a starting signal from (N−1)th GOA unit or a (N−1)th stage horizontal scanning line. An LCD device also uses the GOA circuit to reduce the delay of the gate signal output.

17 Claims, 3 Drawing Sheets

GATE DRIVER ON ARRAY (GOA) CIRCUIT AND LCD DEVICE USING THE SAME

CROSS REFERENCE TO RELATED APPLICATIONS

This application is claiming a priority arisen from a patent application, entitled with "GATE DRIVER ON ARRAY (GOA) CIRCUIT AND LCD DEVICE USING THE SAME", submitted to China Patent Office on Apr. 21, 2014, designated with an Application Number: 201410159672.7. The whole and complete disclosure of such patent application is hereby incorporated by reference. This application also related to National Stage application Ser. No. 14/376,130, submitted on the same date, entitled, "GATE DRIVER ON ARRAY (GOA) CIRCUIT AND LCD DEVICE USING THE SAME" assigned to the same assignee.

BACKGROUND OF THE INVENTION

1. Field of the Invention

The present invention relates to a liquid crystal display, and more particular to a gate driver on array (GOA) circuit and a liquid crystal display device.

2. Description of Related Art

In an active matrix liquid crystal display device, each pixel has a thin film transistor (TFT), the gate of the TFT is connected to a horizontal scanning line, the drain of the TFT is connected to a vertical data line, and the source of the TFT is connected to a pixel electrode. Applying sufficient voltage on the horizontal scanning line, every TFT on the horizontal scanning line will be turned on. The horizontal scanning lines are connected to the vertical data line in order to write a display signal voltage on the data line to the pixel, and achieve the effect of controlling the color through controlling different transmittance of the liquid crystals.

Currently, the driving of the horizontal scanning lines of an active matrix liquid crystal display (LCD) panel is using an external IC connected at the outside of the panel. The external IC can control every stage of the horizontal scanning lines to charge and discharge.

The gate driver on array (GOA) technology can utilize the original fabrication process of the LCD panel to fabricate a driving circuit of the horizontal scan lines on the substrate around the display region such that the driving circuit can replace the external IC to drive the horizontal scan lines. The GOA technology can reduce the bonding process for the external IC to increase productivity and reduce product cost such that the LCD panel is more suitable for the narrow frame or no frame display product.

The conventional GOA circuit generally includes multiple cascaded GOA units; each of the GOA units corresponds to drive a stage of horizontal scanning line. The GOA unit mainly includes a pull-up circuit, a pull-up control circuit, a transfer circuit, a pull-down circuit, a pull-down holding circuit, and a boast capacitor used to boost a voltage. Wherein the pull-up circuit is mainly responsible for outputting a clock signal as a gate signal; the pull-up control circuit is responsible for controlling a turn-on time of the pull-up circuit, and generally connected to a transfer signal or a gate signal from the previous stage GOA unit; the pull-down circuit is responsible for pulling down the gate signal to a low level voltage immediately, that is, turning off the gate signal; the pull-down holding circuit is responsible for holding a gate output signal or the gate signal of the pull-up circuit (commonly referred to as a Q node) at a turn-off state (i.e., a negative voltage). Usually, two pull-down holding circuits function alternatively; the boast capacitor is responsible for secondarily boosting the voltage of the Q node to facilitate the G (N) output of the pull-up circuit.

As shown in FIG. 1, a schematic diagram of a conventional GOA circuit is shown. In FIG. 1, a GOA unit comprises: a pull-up control circuit 100, a pull-up circuit 200, a transfer circuit 300, a pull-down circuit 400, a boast capacitor 500, a first pull-down holding circuit 600, a second pull-down holding circuit 700, and a bridge circuit 800. Wherein, the first pull-down holding circuit 600, the second pull-down holding circuit 700, and the bridge circuit 800 form a voltage dividing with three stage resistors.

Wherein, the bridge circuit 800 adjusts voltages at two terminals P (N) and K (N) through the thin film transistor (TFT) T55. The gate of the T55 connects to Q (N). The drain and the source of the T55 respectively connect to P (N) and K (N). In an operation period, the gate of T55 is turned on such that the voltages of P (N) and K (N) are closed in a turn-off state. Because the low level voltage of each of low frequency signals LC1 and LC2 is smaller than VSS such that the voltages of P (N) and K (N) in the operation period is smaller than VSS in order to guarantee and pull down that the Vgs<0 for the TFTs T32 and T33 connected to G (N) and the Vgs<0 for the TFTs T42 and T43 connected to Q (N). Accordingly, current leakage at G (N) and Q (N) in the operation period is prevented.

The first pull-down holding circuit 600 and the second pull-down holding circuit 700 are symmetrical. One function is: in the operation period, the first pull-down holding circuit 600 (or the second pull-down holding circuit 700) is under a turn-off state with a large resistance. At this time, the second pull-down holding circuit 700 (or the first pull-down holding circuit 600) is under a turn-on state with a small resistance, and the bridge circuit 800 is under a turn-on state with a small resistance such that P (N) and K (N) are under low voltage level to guarantee that the voltage boost of the Q (N) node and the output of the G (N) node; Another function is: In a non-operation period, the first pull-down holding circuit 600 and the second pull-down holding circuit 700 are both under a turn-on state with small resistance, and the bridge circuit is under a turn-off state with large resistance. Therefore, high and low voltage levels and alternative function can be achieved at P (N) and K (N).

The gate of the T54 connects to LC2. The drain of the T54 connects to LC1. The source of the T54 connects to P (N). The gate of the T64 connects to LC1. The drain of the T64 connects to LC2. The source of T64 of the T64 connects to L (N). The two TFTs T54 and T64 are called balance TFTs and are used to adjust voltage dividing and rapid discharge when the signal is switching. The gate of the T52 connects to Q (N). The drain of the T52 connects to S (N). The source of the T52 connects to VSS. The gate of T62 connects to Q (N). The drain of the T62 connects to T (N). The source of the T62 connects to VSS. The two TFTs T52 and T62 mainly guarantee pull down the voltages of S (N) and T (N) in the operation period.

Through the GOA unit having voltage dividing with three stages by the first pull-down holding circuit 600, the second pull-down holding circuit 700 and the bridge circuit 800, temperature stability and long-term reliability of the operation of the pull-down holding circuit can be increased, fully utilizing the low frequency signal to realize the switching of P (N) and K (N), and pulling down the voltages of Q (N) and K (N) to lower voltages to decrease the current leakage of Q (N) and G (N) as possible in the operation period. At the same time, in the non-operation period, one of the P (N) and K (N) in a low voltage level is near the low voltage level of LC. Because the low voltage level of LC is smaller than VSS, T32/T42 or T33/T43 is under a negative voltage recovery status in a half time of the operation period. Through adjusting the low voltage level of the low frequency signal, the risk of failure to the pull-down holding circuit can be decreased.

FIG. 2 is a schematic waveform diagram of key nodes of the GOA circuit illustrated in FIG. 1 during actual operation. As shown in FIG. 2, the voltage of the Q (N) node has two time stages. The voltage of the first time stage (t1~t2) is QV1, and the voltage of the second time stage (t2~t3) is QV2. The G (N) node will output when Q (N) node is under the second time stage. The P (N) and K (N) are controlled by Q (N) through three TFTs T52, T62, and T55. When Q (N) is at a low voltage level, the P (N) and K (N) are at high voltage levels. On the contrary, when the Q (N) is at a high voltage level, the P (N) and K (N) are at low voltage levels. Therefore, as shown in FIG. 2, because the voltage level at the first time stage QV1 of Q (N) is lower, the voltage level of P (N) and K (N) at the first time stage is higher, that is, PV1>PV2. In this case, the T43, T42, T33, and T32 cannot be turned off well. In other words, Q (N) and G (N) have a larger current leakage, which will also pull down the voltage level in the first time stage QV1 of the Q (N). The voltage in second time stage QV2 of the Q (N) will become lower correspondingly. The pull down holding circuit has a higher risk of failure, and the output of the G (N) will generate a serious delay.

Similarly, because the S (N) node and the T (N) node are also controlled by the Q (N) node. Therefore, the same problem is also existed as P (N) and K (N). In order to compensate the voltage lack in the first time stage voltage of Q (N), the three TFTs T52, T62, T55 are designed to become larger in size. The above way will generate a problem of higher ripple current in the non-operation period of Q (N). As a result, the variation at the high voltage level of S (N) and T (N), and P (N) and K (N) is larger in the non-operation period.

SUMMARY OF THE INVENTION

The technical problem solved by the present invention is to provide a GOA circuit for a liquid crystal display and a liquid crystal display device using the same, which can reduce the delay of the gate signal output.

To solve the above technical problem, an embodiment of the present invention provides: a gate driver on array (GOA) circuit for a liquid crystal display including multiple cascaded GOA units, a Nth stage GOA unit for controlling a charging of a Nth stage horizontal scanning line of a display area, and the Nth stage GOA unit comprising:
a pull-up circuit;
a pull-down circuit;
a first pull-down holding circuit and having:
a first thin-film transistor (TFT), wherein, a gate of the first TFT is connected to a first circuit node; a drain and a source of the first TFT are respectively connected to the Nth stage horizontal scanning lines and a low direct current (DC) input voltage;
a second TFT, wherein, a gate of the second TFT is connected to the first circuit node; a drain and a source of the second TFT are respectively connected to a gate signal node and the low direct current (DC) input voltage;
a third TFT, wherein, a gate of the third TFT is connected to the gate signal node; a drain and a source of the third TFT are respectively connected to a source signal node and the low direct current (DC) input voltage;
a fourth TFT, wherein, a source of the fourth TFT is connected to the source signal node; a gate and a drain of the fourth TFT are both connected to a first clock signal;
a fifth TFT, wherein, a gate of the fifth TFT is connected to the source signal node; a drain and a source of the fifth TFT are respectively connected to the first clock signal and the first circuit node;
a sixth TFT, wherein, a gate of the sixth TFT is connected to a second clock signal; a drain and a source of the sixth TFT are respectively connected to the first clock signal and the first circuit node; and
a seventh TFT, wherein, a gate of the seventh TFT is connected to a starting signal from a (N−1)th stage GOA unit or a (N−1)th stage horizontal scanning line; a drain and source of the seventh TFT are respectively connected to the source signal node and the low direct current (DC) input voltage;
a second pull-down holding circuit and having:
an eighth TFT, wherein a gate of the eighth TFT is connected to a second circuit node; a drain and a source of the eighth TFT are respectively connected to the Nth stage horizontal scanning line and the low direct current (DC) input voltage;
a ninth TFT, wherein a gate of the ninth TFT is connected to the second circuit node, a drain and a source of the ninth TFT are respectively connected to the gate signal node and the low direct current (DC) input voltage;
a tenth TFT, wherein a gate of the tenth TFT is connected to the gate signal node; a drain and a source of the tenth TFT are respectively connected to a drain signal node and the low direct current (DC) input voltage;
an eleventh TFT, wherein a source of the eleventh TFT is connected to the drain signal node; a gate and a drain of the eleventh TFT are both connected to the second clock signal;
a twelfth TFT, wherein, a gate of the twelfth TFT is connected to the drain signal node; a drain and a source of the twelfth TFT are respectively connected to the second clock signal and the second circuit node;
a thirteenth TFT, wherein a gate of the thirteenth TFT is connected to the first clock signal; a drain and a source of the thirteenth TFT are respectively connected to the second clock signal and the second circuit node; and
a fourteenth TFT, wherein, a gate of the fourteenth TFT is connected to the gate of the seventh TFT, a drain and a source of the fourteenth TFT are respectively connected to a drain signal node and t the low direct current (DC) input voltage;
a bridge circuit including a fifteenth TFT, wherein, a gate of the fifteenth TFT is connected to the gate signal node; a drain and a source of the fifteenth TFT are respectively connected to the first circuit node and the second circuit node;
a pull-up control circuit;
a transfer circuit; and
a boost capacitor;
wherein, the pull-up circuit, the pull-down circuit, the first pull-down holding circuit, the second pull-down holding circuit, and the boast capacitor are respectively connected to the gate signal node and the Nth stage horizontal scanning line; the pull-up control circuit and the transfer circuit are respectively connected to the gate signal node; the bridge circuit is connected to the first pull-down holding circuit and the second pull-down holding circuit; in an operation period, the frequency of the first clock and the frequency of the second clock signal are lower than a Nth stage clock signal;

a charging by the first clock signal to the first circuit node and a charging by the second clock signal to the second circuit node are executing alternately.

Correspondingly, another aspect of an embodiment of the present invention also provides: a gate driver on array (GOA) circuit for a liquid crystal display including multiple cascaded GOA units, a Nth stage GOA unit for controlling a charging of a Nth stage horizontal scanning line of a display area, and the Nth stage GOA unit comprising:

a pull-up circuit;

a pull-down circuit;

a first pull-down holding circuit and having:

a first thin-film transistor (TFT), wherein, a gate of the first TFT is connected to a first circuit node; a drain and a source of the first TFT are respectively connected to the Nth stage horizontal scanning lines and a low direct current (DC) input voltage;

a second TFT, wherein, a gate of the second TFT is connected to the first circuit node; a drain and a source of the second TFT are respectively connected to a gate signal node and the low direct current (DC) input voltage;

a third TFT, wherein, a gate of the third TFT is connected to the gate signal node; a drain and a source of the third TFT are respectively connected to a source signal node and the low direct current (DC) input voltage;

a fourth TFT, wherein, a source of the fourth TFT is connected to the source signal node; a gate and a drain of the fourth TFT are both connected to a first clock signal;

a fifth TFT, wherein, a gate of the fifth TFT is connected to the source signal node; a drain and a source of the fifth TFT are respectively connected to the first clock signal and the first circuit node; and a sixth TFT, wherein, a gate of the sixth TFT is connected to a second clock signal; a drain and a source of the sixth TFT are respectively connected to the first clock signal and the first circuit node;

a second pull-down holding circuit and having:

an eighth TFT, wherein a gate of the eighth TFT is connected to a second circuit node; a drain and a source of the eighth TFT are respectively connected to the Nth stage horizontal scanning line and the low direct current (DC) input voltage;

a ninth TFT, wherein a gate of the ninth TFT is connected to the second circuit node, a drain and a source of the ninth TFT are respectively connected to the gate signal node and the low direct current (DC) input voltage;

a tenth TFT, wherein a gate of the tenth TFT is connected to the gate signal node; a drain and a source of the tenth TFT are respectively connected to a drain signal node and the low direct current (DC) input voltage;

an eleventh TFT, wherein a source of the eleventh TFT is connected to the drain signal node; a gate and a drain of the eleventh TFT are both connected to the second clock signal;

a twelfth TFT, wherein, a gate of the twelfth TFT is connected to the drain signal node; a drain and a source of the twelfth TFT are respectively connected to the second clock signal and the second circuit node; and a thirteenth TFT, wherein a gate of the thirteenth TFT is connected to the first clock signal; a drain and a source of the thirteenth TFT are respectively connected to the second clock signal and the second circuit node;

a bridge circuit including:

a fifteenth TFT, wherein, a gate of the fifteenth TFT is connected to the gate signal node; a drain and a source of the fifteenth TFT are respectively connected to the first circuit node and the second circuit node; and a sixteenth TFT, wherein a gate of the sixteenth TFT is connected to a starting signal from a (N−1)th stage GOA unit or a (N−1)th stage horizontal scanning line; a drain and a source of the sixteenth TFT are respectively connected to the first circuit node P (N) and the second circuit node K (N);

a pull-up control circuit;

a transfer circuit; and a boast capacitor;

wherein, the pull-up circuit, the pull-down circuit, the first pull-down holding circuit, the second pull-down holding circuit, and the boast capacitor are respectively connected to the gate signal node and the Nth stage horizontal scanning line; the pull-up control circuit and the transfer circuit are respectively connected to the gate signal node; the bridge circuit is connected to the first pull-down holding circuit and the second pull-down holding circuit; in an operation period, the frequency of the first clock and the frequency of the second clock signal are lower than a Nth stage clock signal; a charging by the first clock signal to the first circuit node and a charging by the second clock signal to the second circuit node are executing alternately.

Correspondingly, another aspect of an embodiment of the present invention also provides: a liquid crystal display device including a gate driver on array (GOA) circuit having multiple cascaded GOA units, a Nth stage GOA unit for controlling a charging of a Nth stage horizontal scanning line of a display area, and the Nth stage GOA unit comprising:

a pull-up circuit;

a pull-down circuit;

a first pull-down holding circuit and having:

a first thin-film transistor (TFT), wherein, a gate of the first TFT is connected to a first circuit node; a drain and a source of the first TFT are respectively connected to the Nth stage horizontal scanning lines and a low direct current (DC) input voltage;

a second TFT, wherein, a gate of the second TFT is connected to the first circuit node; a drain and a source of the second TFT are respectively connected to a gate signal node and the low direct current (DC) input voltage;

a third TFT, wherein, a gate of the third TFT is connected to the gate signal node; a drain and a source of the third TFT are respectively connected to a source signal node and the low direct current (DC) input voltage;

a fourth TFT, wherein, a source of the fourth TFT is connected to the source signal node; a gate and a drain of the fourth TFT are both connected to a first clock signal;

a fifth TFT, wherein, a gate of the fifth TFT is connected to the source signal node; a drain and a source of the fifth TFT are respectively connected to the first clock signal and the first circuit node;

a sixth TFT, wherein, a gate of the sixth TFT is connected to a second clock signal; a drain and a source of the sixth TFT are respectively connected to the first clock signal and the first circuit node; and a seventh TFT, wherein, a gate of the seventh TFT is connected to a starting signal from a (N−1)th stage GOA unit or a (N−1)th stage horizontal scanning line; a drain and source of the seventh TFT are respectively connected to the source signal node and the low direct current (DC) input voltage;

a second pull-down holding circuit and having:

an eighth TFT, wherein a gate of the eighth TFT is connected to a second circuit node; a drain and a source of the eighth TFT are respectively connected to the Nth stage horizontal scanning line and the low direct current (DC) input voltage;

a ninth TFT, wherein a gate of the ninth TFT is connected to the second circuit node, a drain and a source of the ninth TFT are respectively connected to the gate signal node and the low direct current (DC) input voltage;

a tenth TFT, wherein a gate of the tenth TFT is connected to the gate signal node; a drain and a source of the tenth TFT are respectively connected to a drain signal node and the low direct current (DC) input voltage;

an eleventh TFT, wherein a source of the eleventh TFT is connected to the drain signal node; a gate and a drain of the eleventh TFT are both connected to the second clock signal;

a twelfth TFT, wherein, a gate of the twelfth TFT is connected to the drain signal node; a drain and a source of the twelfth TFT are respectively connected to the second clock signal and the second circuit node;

a thirteenth TFT, wherein a gate of the thirteenth TFT is connected to the first clock signal; a drain and a source of the thirteenth TFT are respectively connected to the second clock signal and the second circuit node; and a fourteenth TFT, wherein, a gate of the fourteenth TFT is connected to the gate of the seventh TFT, a drain and a source of the fourteenth TFT are respectively connected to a drain signal node and t the low direct current (DC) input voltage;

a bridge circuit including a fifteenth TFT, wherein, a gate of the fifteenth TFT is connected to the gate signal node; a drain and a source of the fifteenth TFT are respectively connected to the first circuit node and the second circuit node;

a pull-up control circuit;

a transfer circuit; and a boast capacitor;

wherein, the pull-up circuit, the pull-down circuit, the first pull-down holding circuit, the second pull-down holding circuit, and the boast capacitor are respectively connected to the gate signal node and the Nth stage horizontal scanning line; the pull-up control circuit and the transfer circuit are respectively connected to the gate signal node; the bridge circuit is connected to the first pull-down holding circuit and the second pull-down holding circuit; in an operation period, the frequency of the first clock and the frequency of the second clock signal are lower than a Nth stage clock signal; a charging by the first clock signal to the first circuit node and a charging by the second clock signal to the second circuit node are executing alternately.

Wherein, the pull-up circuit comprises: a seventeenth TFT, wherein a gate of the seventeenth TFT is connected to the gate signal node; a drain and a source of the seventeenth TFT are respectively for inputting the Nth stage clock signal and connecting to the Nth stage horizontal scanning line.

Wherein, the pull-down circuit comprises:

an eighteenth TFT, wherein, a gate of the eighteenth TFT is connected to a (N+1)th stage horizontal scanning line; a drain and a source of the eighteenth TFT are respectively connected to the Nth stage horizontal scanning line and the low DC input voltage; and a nineteenth TFT, wherein a gate of the nineteenth TFT is connected to the (N+1)th stage horizontal scanning line; a drain and a source of the nineteenth TFT are respectively connected to the gate signal node and the low DC input voltage.

Wherein, the transfer circuit comprises:

a twentieth TFT, wherein, a gate of the twentieth TFT is connected to the gate signal node; a drain and a source of the twentieth TFT are respectively for inputting the Nth stage clock signal and for outputting a Nth stage starting signal.

Wherein, the pull-up control circuit comprises:

a twenty-first TFT, wherein, a gate of the twenty-first TFT is connected to a starting signal from the (N−1)th stage GOA unit; a drain and a source of the twenty-first TFT are respectively connected to the (N−1)th stage horizontal scanning line and the gate signal node.

Wherein, the bridge circuit further comprises a sixteenth TFT, wherein, a gate of the sixteenth TFT is connected to the gate of the seventh TFT; a drain and a source of the sixteenth TFT are respectively connected to the first circuit node and the second circuit node.

The present invention has the following advantageous effects:

Firstly, in the pull down holding circuit, the seventh TFT T56 and the fourteenth TFT T66 are respectively connected in parallel with the third TFT T52 and the tenth TFT T62 which are used for pulling down the source signal node S (N) and the drain signal node T (N). Besides, the gate of the seventh TFT T56 and the gate of the fourteenth TFT T66 are connected to ST (N−1) or G (N−1) to compensate the problem of higher voltages of nodes S (N) and T (N) because of lower voltage of Q (N) in the first time stage. Furthermore, the pull-down voltages of the first circuit node P (N) and the second circuit node K (N) can be improved.

In addition, the sixteenth TFT T57 is connected in parallel with the fifteenth TFT T55 in the bridge circuit, and the gate of the sixteenth TFT T57 is connected to ST (N−1) or G (N−1) in order to effectively compensate the lack voltage of Q (N) in the first time stage. As a result, the size of the third TFT T52, the tenth TFT T62, and the fifteenth TFT T55 which are all controlled by the Q (N) can be reduced. Besides, because the ripple current of ST (N−1) and G (N−1) in the non-operation period is smaller than Q (N), the voltage variation problem of the source signal node S (N), the drain signal node T (N), the first circuit node P (N), and the second circuit node K (N) can be solved.

BRIEF DESCRIPTION OF THE DRAWINGS

In order to more clearly illustrate the technical solution in the present invention or in the prior art, the following will illustrate the figures used for describing the embodiments or the prior art. It is obvious that the following figures are only some embodiments of the present invention. For the skilled persons of ordinary skill in the art without creative effort, it can also obtain other figures according to these figures.

DETAILED DESCRIPTION OF THE PREFERRED EMBODIMENT

Figure 1:
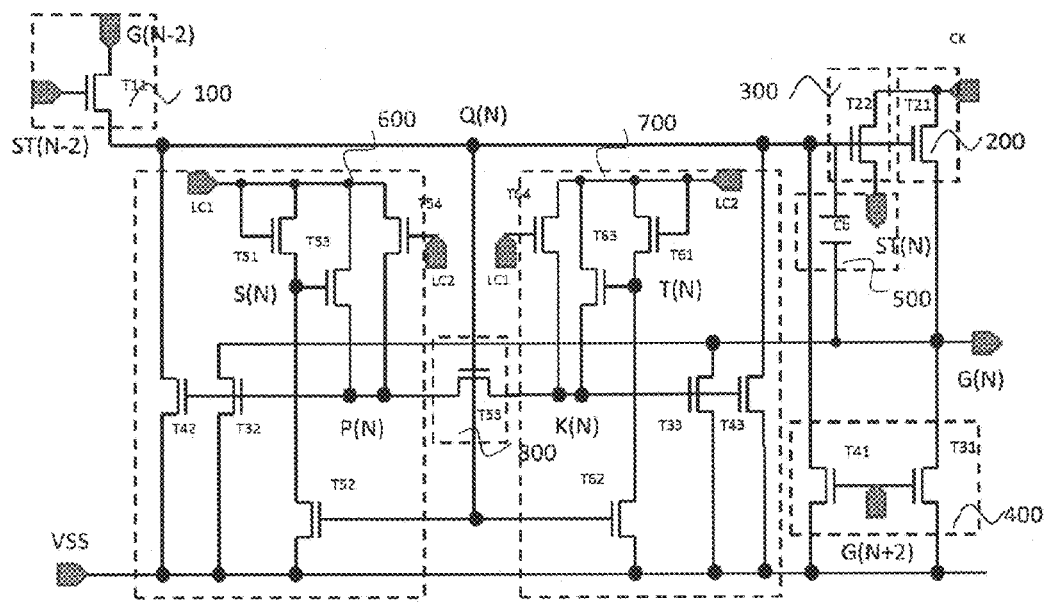
FIG. 1 is a schematic diagram of a conventional GOA circuit.
Figure 2:
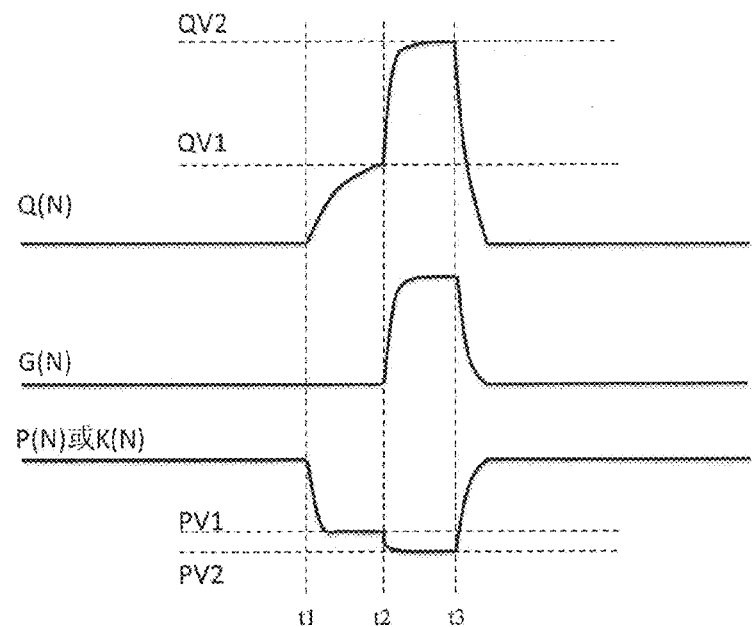
FIG. 2 is a schematic waveform diagram of key nodes of the GOA circuit illustrated in FIG. 1 in an actual operation.
Figure 3:
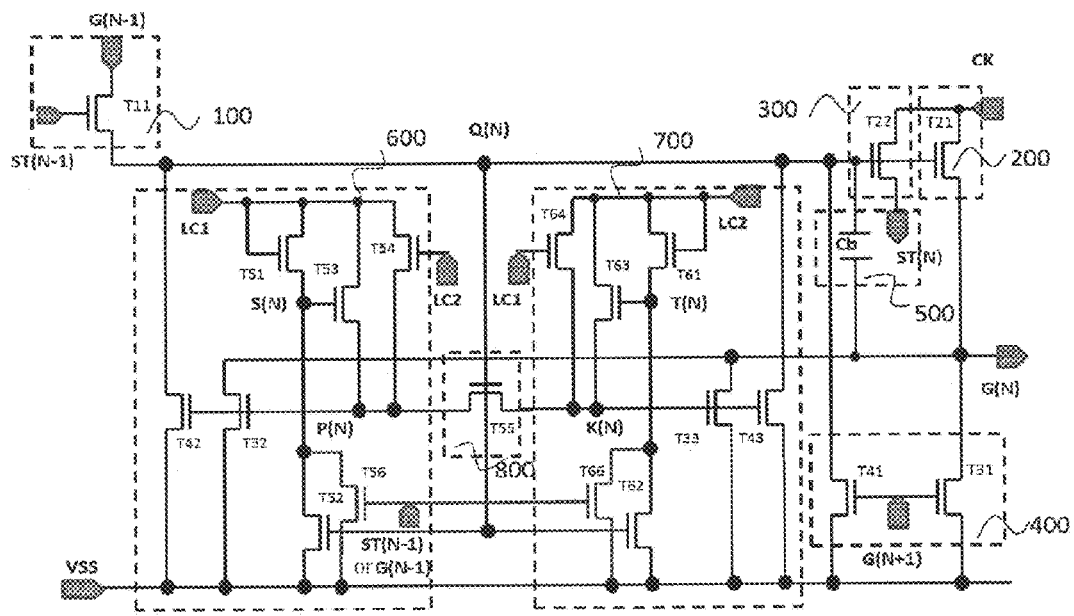
FIG. 3 is a schematic diagram of a GOA circuit for a liquid crystal display according to a first embodiment of the present invention.

The following content combines with the drawings for describing preferred embodiments of the present invention FIG. 3 is a schematic diagram of a GOA circuit for a liquid crystal display according to a first embodiment of the present invention. In this embodiment, the GOA circuit includes multiple cascaded GOA units. A Nth stage GOA unit charges a Nth stage horizontal scanning line G (N). The Nth stage GOA unit comprises a pull-up circuit 200, a pull-down circuit 400, a first pull-down holding circuit 600, a second pull-down holding circuit 700, a bridge circuit 800, a pull-up control circuit 100, a transfer circuit 300, and a boast capacitor Cb. Wherein, the pull-up circuit 200, the pull-down circuit 400, the first pull-down holding circuit 600, the second pull-down holding circuit 700, and the boast capacitor Cb are respectively connected to a gate signal node Q (N) and the Nth stage horizontal scanning line G (N). The pull-up control circuit 100 and the transfer circuit 300 are respectively connected to the gate signal node Q (N). The bridge circuit 800 is connected to the first pull-down holding circuit 600 and the second pull-down holding circuit 700.

Wherein the first pull-down holding circuit 600 includes:

a first TFT T32, wherein, a gate of the T32 is connected to a first circuit node P (N); a drain and a source of the T32 are respectively connected to a Nth stage horizontal scanning lines G (N) and a low direct current (DC) input voltage VSS;

a second TFT T42, wherein, a gate of the T42 is connected to the first circuit node P (N); a drain and a source of the T42 are respectively connected to a gate signal node Q (N) and the low direct current (DC) input voltage VSS;

a third TFT T52, wherein, a gate of the T52 is connected to the gate signal node Q (N); a drain and a source of the T52 are respectively connected to a source signal node S (N) and the low direct current (DC) input voltage VSS;

a fourth TFT T51, wherein, a source of the T51 is connected to the source signal node S (N); a gate and a drain of the T51 are both connected to a first clock signal LC1;

a fifth TFT T53, wherein, a gate of the T53 is connected to the source signal node S (N); a drain and a source of the T53 are respectively connected to the first clock signal LC1 and the first circuit node P (N);

a sixth TFT T54, wherein, a gate of the T54 is connected to a second clock signal LC2; a drain and a source of the T54 are respectively connected to the first clock signal LC1 and the first circuit node P (N);

a seventh TFT T56, wherein, a gate of the T56 is connected to a starting signal ST (N−1) from a (N−1)th stage GOA unit or a (N−1)th stage horizontal scanning line G (N−1); a drain and source of the T56 are respectively connected to the source signal node S (N) and the low direct current (DC) input voltage VSS;

The second pull-down holding circuit 700 includes:

an eighth TFT T33, wherein a gate of the T33 is connected to a second circuit node K (N); a drain and a source of the T33 are respectively connected to the Nth stage horizontal scanning line G (N) and the low direct current (DC) input voltage VSS;

a ninth TFT T43, wherein a gate of the T43 is connected to the second circuit node K (N), a drain and a source of the T43 are respectively connected to the gate signal node Q (N) and the low direct current (DC) input voltage VSS;

a tenth TFT T62, wherein a gate of the T62 is connected to the gate signal node Q (N); a drain and a source of the T62 are respectively connected to a drain signal node T (N) and the low direct current (DC) input voltage VSS;

an eleventh TFT T61, wherein a source of the T61 is connected to the drain signal node T (N); a gate and a drain of the T61 are both connected to the second clock signal LC2;

a twelfth TFT T63, wherein, a gate of the T63 is connected to the drain signal node T (N); a drain and a source of the T63 are respectively connected to the second clock signal LC2 and the second circuit node K (N);

a thirteenth TFT T64, wherein a gate of the T64 is connected to the first clock signal LC1; a drain and a source of the T64 are respectively connected to the second clock signal LC2 and the second circuit node K (N);

a fourteenth TFT T66, wherein, a gate of the T66 is connected to the gate of the seventh TFT T56, a drain and a source of the T66 are respectively connected to the drain signal node T (N) and the low direct current (DC) input voltage VSS;

The bridge circuit 800 includes a fifteenth TFT T55, wherein, a gate of the T55 is connected to the gate signal node Q (N); a drain and a source of the T55 are respectively connected to the first circuit node P (N) and the second circuit node K (N);

In an operation period, the frequency of the first clock signal LC1 and the frequency of the second clock signal LC2 are lower than the Nth clock signal CK (N). A charging by the first clock signal LC1 to the first circuit node P (N) and a charging by the second clock signal LC2 to the second circuit node K (N) are executing alternately.

Specifically, the pull-up circuit 200 includes:

a seventeenth TFT T21, wherein a gate of the T21 is connected to the gate signal node Q (N), a drain and a source of the T21 are respectively for inputting the Nth stage clock signal CK (N) and connecting to the Nth stage horizontal scanning line G (N).

A pull-down circuit 400 includes:

an eighteenth TFT T31, wherein, a gate of the T31 is connected to a (N+1)th stage horizontal scanning line G (N+1), a drain and a source of the T31 are respectively connected to the Nth stage horizontal scanning line G (N) and the low DC input voltage VSS;

a nineteenth TFT T41, wherein a gate of the T41 is connected to the (N+1)th stage horizontal scanning line G (N+1), a drain and a source of the T41 are respectively connected to the gate signal node Q (N) and the low direct current (DC) input voltage VSS.

A transfer circuit 300 comprises:

a twentieth TFT T22, wherein, a gate of the T22 is connected to the gate signal node Q (N); a drain and a source of the T22 are respectively for inputting the Nth stage clock signal CK (N) and for outputting the Nth stage starting signal ST (N).

A pull-up control circuit 100 comprises:

a twenty-first TFT T11, wherein, a gate of the T11 is connected to the starting signal ST (N−1) from the (N−1)th stage GOA unit; a drain and a source of the T11 are respectively connected to the (N−1)th horizontal scanning line G (N−1) and the gate signal node Q (N).

In the present embodiment, the T56 and T52 are connected in parallel. The T66 and T62 are connected in parallel. A gate of the T66 is connected to a gate of the T56. The gate of the T66 and the gate of the T56 are connected to the starting signal ST (N−1) from the (N−1)th stage GOA unit or the (N−1)th stage horizontal scanning line G (N−1) from the (N−1)th stage GOA unit. Therefore, the signals of the ST (N−1) or the G (N−1) can compensate the voltage lack of G (N) in the first time stage, and can reduce the size of the T52 and the T62.

Figure 4:
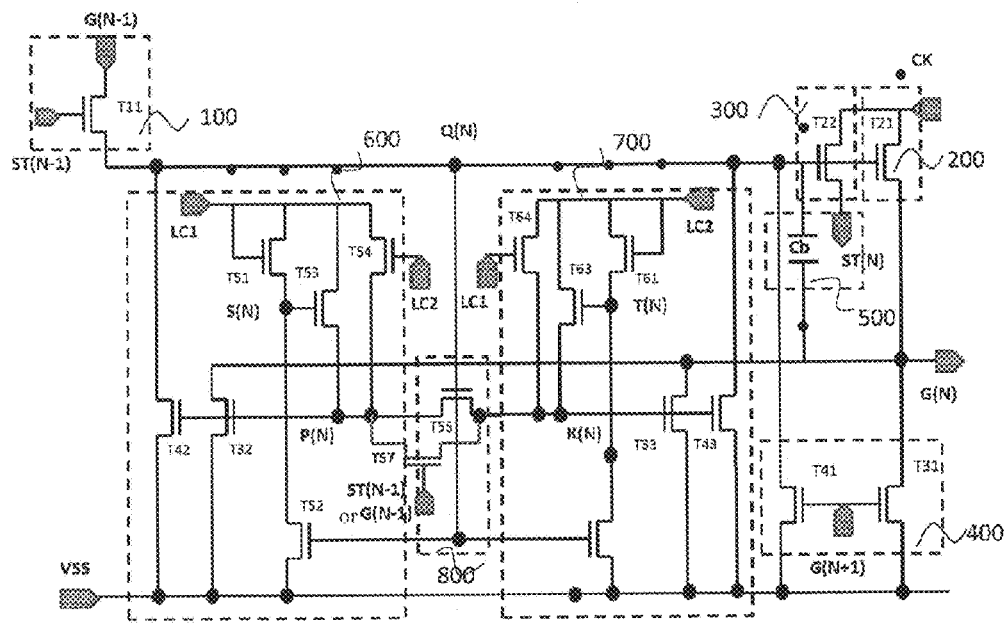
FIG. 4 is a schematic diagram of a GOA circuit for a liquid crystal display according to a second embodiment of the present invention.

FIG. 4 is a schematic diagram of a GOA circuit for a liquid crystal display according to a second embodiment of the present invention. In this embodiment, the GOA circuit includes multiple cascaded GOA units, wherein, the difference between a Nth stage GOA unit in FIG. 4 and the Nth stage GOA unit in FIG. 3 is that the seventh TFT T56 and the fourteenth TFT T66 do not exist. In this embodiment, the bridge circuit 800 further comprises:

a sixteenth TFT T57, wherein, a gate of the T57 is connected to the starting signal ST (N−1) from the (N−1)th GOA unit or the (N−1)th horizontal scanning line G (N−1) from the (N−1)th GOA unit; a drain and a source of the T57 are respectively connected to the first circuit node P (N) and the second circuit node K (N).

In the present embodiment, the T57 and the T55 are connected in parallel. The gate of the T57 is connected to the starting signal ST (N−1) from the (N−1)th stage GOA unit or the (N−1)th stage horizontal scanning line G (N−1). The signal ST (N−1) and G (N−1) can compensate the voltage lack of G (N) in the first time stage, and the size of the T55 can be reduced. Besides, because the ripple current of ST (N−1) and G (N−1) in the non-operation period is smaller than Q (N), through reducing the size of the T55, the voltage variation of P (N) and K (N) in the non-operation period can also be reduced.

Figure 5:
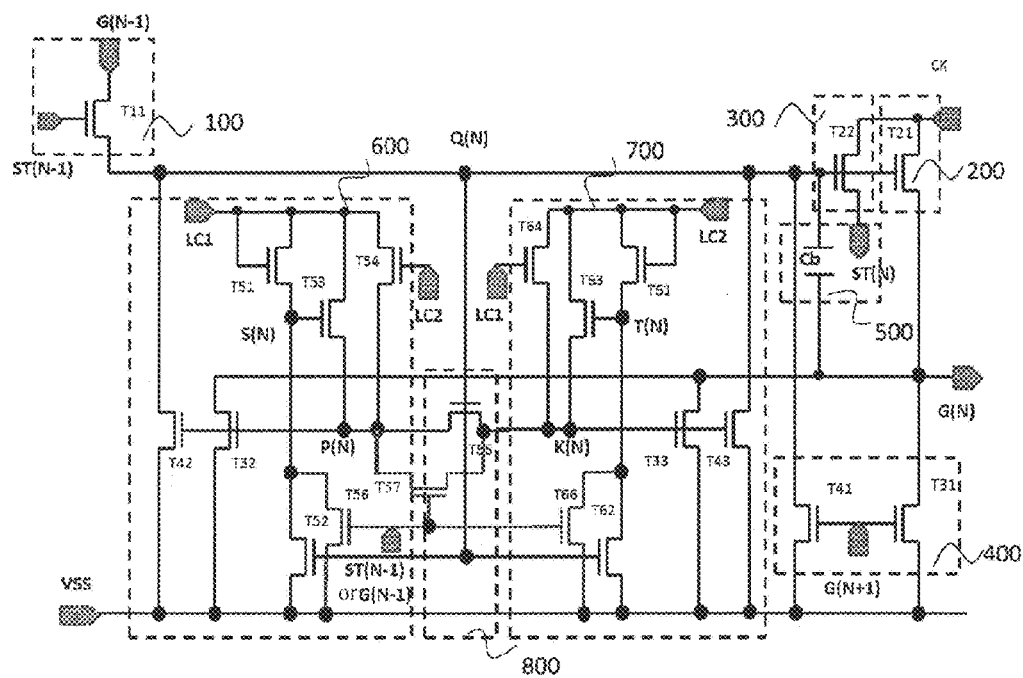
FIG. 5 is a schematic diagram of a GOA circuit for a liquid crystal display according to a third embodiment of the present invention.

FIG. 5 is a schematic diagram of a GOA circuit for a liquid crystal display according to a third embodiment of the present invention. In this embodiment, the GOA circuit includes multiple cascaded GOA units, wherein, the difference between a Nth stage GOA unit in FIG. 5 and the Nth stage GOA unit in FIG. 3 is that the bridge circuit 800 further comprises: a sixteenth TFT T57, wherein a gate of the T57 is connected to the starting signal ST (N−1) from the (N−1)th GOA unit or the (N−1)th stage horizontal scanning line G (N−1); a drain and a source of the T57 are respectively connected to the first circuit node P (N) and the second circuit node K (N).

In this embodiment, the gate of the T57, the gate of the T56, and the gate of the T66 are connected each other. The three gates are all connected to the starting signal ST (N−1) from the (N−1)th stage GOA unit or the (N−1)th stage horizontal scanning line G (N−1). As a result, four nodes S (N), T (N), P (N), and K (N) are mutual operated in order to ensure the stability of the circuit. Similarly, in this embodiment, ST (N−1) and G (N−1) can compensate the voltage lack of G (N) in the first time stage. Therefore, the size of the T55 can be reduced. Besides, because the ripple current of the signal ST (N−1) and G (N−1) in the non-operation period is smaller than Q (N), through reducing the size of the T55, the voltage variation of P (N) and K (N) in the non-operation period can also be reduced.

Figure 6:
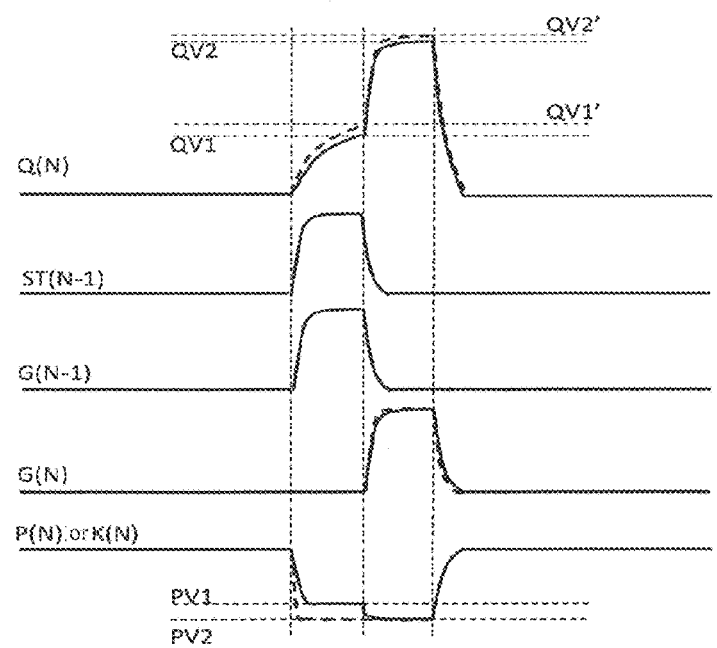
FIG. 6 is a schematic waveform diagram of key nodes of the GOA circuit illustrated in FIG. 5 in an actual operation.

FIG. 6 is a schematic waveform diagram of key nodes of the GOA circuit illustrated in FIG. 5 during actual operation. Wherein, because using ST (N−1) or G (N−1) to assist pulling down of the Q (N), which can ensure that in the first time stage, the P (N) and the T (N) can be pulled down from PV1 to PV2 (as shown by a dashed line). The S (N) and the T (N) are similar. As a result, the voltage of the Q (N) can be increased certainly such that a delay of output waveform of the Q (N) is reduced (as shown by a dashed line), and a delay of output waveform of the G (N) is reduced (as shown by a dashed line) as well.

Correspondingly, the present invention also provides with a liquid crystal display device, and the device comprises the GOA circuit for the liquid crystal display illustrate in the aforementioned circuit of FIG. 3 to FIG. 6.

The present invention has the following beneficial effects:

Firstly, in the pull down holding circuit, the seventh TFT T56 and the fourteenth TFT T66 are respectively connected in parallel with the third TFT T52 and the tenth TFT T62 which are used for pulling down the source signal node S (N) and the drain signal node T (N). Besides, the gate of the seventh TFT T56 and the gate of the fourteenth TFT T66 are connected to ST (N−1) or G (N−1) to compensate the problem of higher voltages of nodes S (N) and T (N) because of lower voltage of Q (N) in the first time stage. Furthermore, the pull-down voltages of the first circuit node P (N) and the second circuit node K (N) can be improved.

In addition, the sixteenth TFT T57 is connected in parallel with the fifteenth TFT T55 in the bridge circuit, and the gate of the sixteenth TFT T57 is connected to ST (N−1) or G (N−1) in order to effectively compensate the lack voltage of Q (N) in the first time stage. As a result, the size of the third TFT T52, the tenth TFT T62, and the fifteenth TFT T55 which are all controlled by the Q (N) can be reduced. Besides, because the ripple current of ST (N−1) and G (N−1) in the non-operation period is smaller than Q (N), the voltage variation problem of the source signal node S (N), the drain signal node T (N), the first circuit node P (N), and the second circuit node K (N) can be solved.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. A gate driver on array (GOA) circuit for a liquid crystal display including multiple cascaded GOA units, a Nth stage GOA unit for controlling a charging of a Nth stage horizontal scanning line of a display area, and the Nth stage GOA unit comprising:

a pull-up circuit;

a pull-down circuit;

a first pull-down holding circuit and having:

a first thin-film transistor (TFT), wherein, a gate of the first TFT is connected to a first circuit node; a drain and a source of the first TFT are respectively connected to the Nth stage horizontal scanning lines and a low direct current (DC) input voltage;

a second TFT, wherein, a gate of the second TFT is connected to the first circuit node; a drain and a source of the second TFT are respectively connected to a gate signal node and the low direct current (DC) input voltage;

a third TFT, wherein, a gate of the third TFT is connected to the gate signal node; a drain and a source of the third TFT are respectively connected to a source signal node and the low direct current (DC) input voltage;

a fourth TFT, wherein, a source of the fourth TFT is connected to the source signal node; a gate and a drain of the fourth TFT are both connected to a first clock signal;

a fifth TFT, wherein, a gate of the fifth TFT is connected to the source signal node; a drain and a source of the fifth TFT are respectively connected to the first clock signal and the first circuit node;

a sixth TFT, wherein, a gate of the sixth TFT is connected to a second clock signal; a drain and a source of the sixth TFT are respectively connected to the first clock signal and the first circuit node; and a seventh TFT, wherein, a gate of the seventh TFT is connected to a starting signal from a (N−1)th stage GOA unit or a (N−1)th stage horizontal scanning line; a drain and source of the seventh TFT are respectively connected to the source signal node and the low direct current (DC) input voltage;

a second pull-down holding circuit and having:
an eighth TFT, wherein a gate of the eighth TFT is connected to a second circuit node; a drain and a source of the eighth TFT are respectively connected to the Nth stage horizontal scanning line and the low direct current (DC) input voltage;
a ninth TFT, wherein a gate of the ninth TFT is connected to the second circuit node, a drain and a source of the ninth TFT are respectively connected to the gate signal node and the low direct current (DC) input voltage;
a tenth TFT, wherein a gate of the tenth TFT is connected to the gate signal node; a drain and a source of the tenth TFT are respectively connected to a drain signal node and the low direct current (DC) input voltage;
an eleventh TFT, wherein a source of the eleventh TFT is connected to the drain signal node; a gate and a drain of the eleventh TFT are both connected to the second clock signal;
a twelfth TFT, wherein, a gate of the twelfth TFT is connected to the drain signal node; a drain and a source of the twelfth TFT are respectively connected to the second clock signal and the second circuit node;
a thirteenth TFT, wherein a gate of the thirteenth TFT is connected to the first clock signal; a drain and a source of the thirteenth TFT are respectively connected to the second clock signal and the second circuit node; and
a fourteenth TFT, wherein, a gate of the fourteenth TFT is connected to the gate of the seventh TFT, a drain and a source of the fourteenth TFT are respectively connected to a drain signal node and t the low direct current (DC) input voltage;

a bridge circuit including a fifteenth TFT, wherein, a gate of the fifteenth TFT is connected to the gate signal node; a drain and a source of the fifteenth TFT are respectively connected to the first circuit node and the second circuit node;

a pull-up control circuit;
a transfer circuit; and
a boast capacitor;
wherein, the pull-up circuit, the pull-down circuit, the first pull-down holding circuit, the second pull-down holding circuit, and the boast capacitor are respectively connected to the gate signal node and the Nth stage horizontal scanning line; the pull-up control circuit and the transfer circuit are respectively connected to the gate signal node; the bridge circuit is connected to the first pull-down holding circuit and the second pull-down holding circuit; in an operation period, the frequency of the first clock and the frequency of the second clock signal are lower than a Nth stage clock signal; a charging by the first clock signal to the first circuit node and a charging by the second clock signal to the second circuit node are executing alternately.

2. The GOA circuit for the liquid crystal display according to claim 1, wherein, the pull-up circuit comprises: a seventeenth TFT, wherein a gate of the seventeenth TFT is connected to the gate signal node; a drain and a source of the seventeenth TFT are respectively for inputting the Nth stage clock signal and connecting to the Nth stage horizontal scanning line.

3. The GOA circuit for the liquid crystal display according to claim 2, wherein, the pull-down circuit comprises:
an eighteenth TFT, wherein, a gate of the eighteenth TFT is connected to a (N+1)th stage horizontal scanning line; a drain and a source of the eighteenth TFT are respectively connected to the Nth stage horizontal scanning line and the low DC input voltage; and
a nineteenth TFT, wherein a gate of the nineteenth TFT is connected to the (N+1)th stage horizontal scanning line; a drain and a source of the nineteenth TFT are respectively connected to the gate signal node and the low DC input voltage.

4. The GOA circuit for the liquid crystal display according to claim 3, wherein, the transfer circuit comprises:
a twentieth TFT, wherein, a gate of the twentieth TFT is connected to the gate signal node; a drain and a source of the twentieth TFT are respectively for inputting the Nth stage clock signal and for outputting a Nth stage starting signal.

5. The GOA circuit for the liquid crystal display according to claim 4, wherein, the pull-up control circuit comprises:
a twenty-first TFT, wherein, a gate of the twenty-first TFT is connected to a starting signal from the (N−1)th stage GOA unit; a drain and a source of the twenty-first TFT are respectively connected to the (N−1)th stage horizontal scanning line and the gate signal node.

6. The GOA circuit for the liquid crystal display according to claim 5, wherein, the bridge circuit further comprises a sixteenth TFT, wherein, a gate of the sixteenth TFT is connected to the gate of the seventh TFT; a drain and a source of the sixteenth TFT are respectively connected to the first circuit node and the second circuit node.

7. A gate driver on array (GOA) circuit for a liquid crystal display including multiple cascaded GOA units, a Nth stage GOA unit for controlling a charging of a Nth stage horizontal scanning line of a display area, and the Nth stage GOA unit comprising:
a pull-up circuit;
a pull-down circuit;
a first pull-down holding circuit and having:
a first thin-film transistor (TFT), wherein, a gate of the first TFT is connected to a first circuit node; a drain and a source of the first TFT are respectively connected to the Nth stage horizontal scanning lines and a low direct current (DC) input voltage;
a second TFT, wherein, a gate of the second TFT is connected to the first circuit node; a drain and a source of the second TFT are respectively connected to a gate signal node and the low direct current (DC) input voltage;
a third TFT, wherein, a gate of the third TFT is connected to the gate signal node; a drain and a source of the third TFT are respectively connected to a source signal node and the low direct current (DC) input voltage;
a fourth TFT, wherein, a source of the fourth TFT is connected to the source signal node; a gate and a drain of the fourth TFT are both connected to a first clock signal;
a fifth TFT, wherein, a gate of the fifth TFT is connected to the source signal node; a drain and a source of the fifth TFT are respectively connected to the first clock signal and the first circuit node; and
a sixth TFT, wherein, a gate of the sixth TFT is connected to a second clock signal; a drain and a source of the sixth TFT are respectively connected to the first clock signal and the first circuit node;

a second pull-down holding circuit and having:
an eighth TFT, wherein a gate of the eighth TFT is connected to a second circuit node; a drain and a source of the eighth TFT are respectively connected to the Nth stage horizontal scanning line and the low direct current (DC) input voltage;
a ninth TFT, wherein a gate of the ninth TFT is connected to the second circuit node, a drain and a source of the ninth TFT are respectively connected to the gate signal node and the low direct current (DC) input voltage;
a tenth TFT, wherein a gate of the tenth TFT is connected to the gate signal node; a drain and a source of the tenth TFT are respectively connected to a drain signal node and the low direct current (DC) input voltage;
an eleventh TFT, wherein a source of the eleventh TFT is connected to the drain signal node; a gate and a drain of the eleventh TFT are both connected to the second clock signal;
a twelfth TFT, wherein, a gate of the twelfth TFT is connected to the drain signal node; a drain and a source of the twelfth TFT are respectively connected to the second clock signal and the second circuit node; and
a thirteenth TFT, wherein a gate of the thirteenth TFT is connected to the first clock signal; a drain and a source of the thirteenth TFT are respectively connected to the second clock signal and the second circuit node;
a bridge circuit including:
a fifteenth TFT, wherein, a gate of the fifteenth TFT is connected to the gate signal node; a drain and a source of the fifteenth TFT are respectively connected to the first circuit node and the second circuit node; and
a sixteenth TFT, wherein a gate of the sixteenth TFT is connected to a starting signal from a (N−1)th stage GOA unit or a (N−1)th stage horizontal scanning line; a drain and a source of the sixteenth TFT are respectively connected to the first circuit node P (N) and the second circuit node K (N);
a pull-up control circuit;
a transfer circuit; and
a boast capacitor;
wherein, the pull-up circuit, the pull-down circuit, the first pull-down holding circuit, the second pull-down holding circuit, and the boast capacitor are respectively connected to the gate signal node and the Nth stage horizontal scanning line; the pull-up control circuit and the transfer circuit are respectively connected to the gate signal node; the bridge circuit is connected to the first pull-down holding circuit and the second pull-down holding circuit; in an operation period, the frequency of the first clock and the frequency of the second clock signal are lower than a Nth stage clock signal; a charging by the first clock signal to the first circuit node and a charging by the second clock signal to the second circuit node are executing alternately.

8. The GOA circuit for the liquid crystal display according to claim 7, wherein, the pull-up circuit comprises: a seventeenth TFT, wherein a gate of the seventeenth TFT is connected to the gate signal node; a drain and a source of the seventeenth TFT are respectively for inputting the Nth stage clock signal and connecting to the Nth stage horizontal scanning line.

9. The GOA circuit for the liquid crystal display according to claim 8, wherein, the pull-down circuit comprises:
an eighteenth TFT, wherein, a gate of the eighteenth TFT is connected to a (N+1)th stage horizontal scanning line; a drain and a source of the eighteenth TFT are respectively connected to the Nth stage horizontal scanning line and the low DC input voltage; and
a nineteenth TFT, wherein a gate of the nineteenth TFT is connected to the (N+1)th stage horizontal scanning line; a drain and a source of the nineteenth TFT are respectively connected to the gate signal node and the low DC input voltage.

10. The GOA circuit for the liquid crystal display according to claim 9, wherein, the transfer circuit comprises:
a twentieth TFT, wherein, a gate of the twentieth TFT is connected to the gate signal node; a drain and a source of the twentieth TFT are respectively for inputting the Nth stage clock signal and for outputting a Nth stage starting signal.

11. The GOA circuit for the liquid crystal display according to claim 10, wherein, the pull-up control circuit comprises:
a twenty-first TFT, wherein, a gate of the twenty-first TFT is connected to a starting signal from the (N−1)th stage GOA unit; a drain and a source of the twenty-first TFT are respectively connected to the (N−1)th stage horizontal scanning line and the gate signal node.

12. A liquid crystal display device including a gate driver on array (GOA) circuit having multiple cascaded GOA units, a Nth stage GOA unit for controlling a charging of a Nth stage horizontal scanning line of a display area, and the Nth stage GOA unit comprising:
a pull-up circuit;
a pull-down circuit;
a first pull-down holding circuit and having:
a first thin-film transistor (TFT), wherein, a gate of the first TFT is connected to a first circuit node; a drain and a source of the first TFT are respectively connected to the Nth stage horizontal scanning lines and a low direct current (DC) input voltage;
a second TFT, wherein, a gate of the second TFT is connected to the first circuit node; a drain and a source of the second TFT are respectively connected to a gate signal node and the low direct current (DC) input voltage;
a third TFT, wherein, a gate of the third TFT is connected to the gate signal node; a drain and a source of the third TFT are respectively connected to a source signal node and the low direct current (DC) input voltage;
a fourth TFT, wherein, a source of the fourth TFT is connected to the source signal node; a gate and a drain of the fourth TFT are both connected to a first clock signal;
a fifth TFT, wherein, a gate of the fifth TFT is connected to the source signal node; a drain and a source of the fifth TFT are respectively connected to the first clock signal and the first circuit node;
a sixth TFT, wherein, a gate of the sixth TFT is connected to a second clock signal; a drain and a source of the sixth TFT are respectively connected to the first clock signal and the first circuit node; and
a seventh TFT, wherein, a gate of the seventh TFT is connected to a starting signal from a (N−1)th stage GOA unit or a (N−1)th stage horizontal scanning line; a drain and source of the seventh TFT are respectively connected to the source signal node and the low direct current (DC) input voltage;

a second pull-down holding circuit and having:
  an eighth TFT, wherein a gate of the eighth TFT is connected to a second circuit node; a drain and a source of the eighth TFT are respectively connected to the Nth stage horizontal scanning line and the low direct current (DC) input voltage;
  a ninth TFT, wherein a gate of the ninth TFT is connected to the second circuit node, a drain and a source of the ninth TFT are respectively connected to the gate signal node and the low direct current (DC) input voltage;
  a tenth TFT, wherein a gate of the tenth TFT is connected to the gate signal node; a drain and a source of the tenth TFT are respectively connected to a drain signal node and the low direct current (DC) input voltage;
  an eleventh TFT, wherein a source of the eleventh TFT is connected to the drain signal node; a gate and a drain of the eleventh TFT are both connected to the second clock signal;
  a twelfth TFT, wherein, a gate of the twelfth TFT is connected to the drain signal node; a drain and a source of the twelfth TFT are respectively connected to the second clock signal and the second circuit node;
  a thirteenth TFT, wherein a gate of the thirteenth TFT is connected to the first clock signal; a drain and a source of the thirteenth TFT are respectively connected to the second clock signal and the second circuit node; and
  a fourteenth TFT, wherein, a gate of the fourteenth TFT is connected to the gate of the seventh TFT, a drain and a source of the fourteenth TFT are respectively connected to a drain signal node and t the low direct current (DC) input voltage;

a bridge circuit including a fifteenth TFT, wherein, a gate of the fifteenth TFT is connected to the gate signal node; a drain and a source of the fifteenth TFT are respectively connected to the first circuit node and the second circuit node;

a pull-up control circuit;

a transfer circuit; and a boast capacitor;

wherein, the pull-up circuit, the pull-down circuit, the first pull-down holding circuit, the second pull-down holding circuit, and the boast capacitor are respectively connected to the gate signal node and the Nth stage horizontal scanning line; the pull-up control circuit and the transfer circuit are respectively connected to the gate signal node; the bridge circuit is connected to the first pull-down holding circuit and the second pull-down holding circuit; in an operation period, the frequency of the first clock and the frequency of the second clock signal are lower than a Nth stage clock signal; a charging by the first clock signal to the first circuit node and a charging by the second clock signal to the second circuit node are executing alternately.

13. The liquid crystal display device according to claim 12, wherein, the pull-up circuit comprises: a seventeenth TFT, wherein a gate of the seventeenth TFT is connected to the gate signal node; a drain and a source of the seventeenth TFT are respectively for inputting the Nth stage clock signal and connecting to the Nth stage horizontal scanning line.

14. The liquid crystal display device according to claim 13, wherein, the pull-down circuit comprises:
  an eighteenth TFT, wherein, a gate of the eighteenth TFT is connected to a (N+1)th stage horizontal scanning line; a drain and a source of the eighteenth TFT are respectively connected to the Nth stage horizontal scanning line and the low DC input voltage; and
  a nineteenth TFT, wherein a gate of the nineteenth TFT is connected to the (N+1)th stage horizontal scanning line; a drain and a source of the nineteenth TFT are respectively connected to the gate signal node and the low DC input voltage.

15. The liquid crystal display device according to claim 14, wherein the transfer circuit comprises:
  a twentieth TFT, wherein, a gate of the twentieth TFT is connected to the gate signal node; a drain and a source of the twentieth TFT are respectively for inputting the Nth stage clock signal and for outputting a Nth stage starting signal.

16. The liquid crystal display device according to claim 15, wherein, the pull-up control circuit comprises:
  a twenty-first TFT, wherein, a gate of the twenty-first TFT is connected to a starting signal from the (N−1)th stage GOA unit; a drain and a source of the twenty-first TFT are respectively connected to the (N−1)th stage horizontal scanning line and the gate signal node.

17. The liquid crystal display device according to claim 16, wherein the bridge circuit further comprises a sixteenth TFT, wherein, a gate of the sixteenth TFT is connected to the gate of the seventh TFT; a drain and a source of the sixteenth TFT are respectively connected to the first circuit node and the second circuit node.

\* \* \* \* \*